(12) United States Patent
Haldar et al.

(10) Patent No.: US 9,880,246 B2
(45) Date of Patent: Jan. 30, 2018

(54) LINEAR TRANSFORM FOR DIFFUSION MRI

(71) Applicants: Justin P. Haldar, Los Angeles, CA (US); Richard M. Leahy, El Segundo, CA (US)

(72) Inventors: Justin P. Haldar, Los Angeles, CA (US); Richard M. Leahy, El Segundo, CA (US)

(73) Assignee: University of Southern California, Los Angeles, CA (US)

( * ) Notice: Subject to any disclaimer, the term of this patent is extended or adjusted under 35 U.S.C. 154(b) by 726 days.

(21) Appl. No.: 14/166,712

(22) Filed: Jan. 28, 2014

(65) Prior Publication Data

US 2014/0210474 A1 Jul. 31, 2014

Related U.S. Application Data

(60) Provisional application No. 61/757,619, filed on Jan. 28, 2013.

(51) Int. Cl.
*G01R 33/56* (2006.01)
*G01R 33/563* (2006.01)

(52) U.S. Cl.
CPC ... *G01R 33/5608* (2013.01); *G01R 33/56341* (2013.01)

(58) Field of Classification Search
CPC .................. G01R 33/5608; G01R 33/56341
See application file for complete search history.

(56) References Cited

U.S. PATENT DOCUMENTS 7,034,531 B1 4/2006 Tuch et al.

OTHER PUBLICATIONS

Sarty et al, Direct Reconstruction of Non-Cartesian k-Space Data Using a Nonuniform Fast Fourier Transform.*
Aganj, I. et al. 2010. Reconstruction of the orientation distribution function in single- and multiple-shell q-ball imaging within constant solid angle, Magn. Reson. Med. 64, 554-566.
Descoteaux, M. et al. 2007. Regularized, fast, and robust analytical Q-ball imaging. Magn. Reson. Med. 58, 497-510.
Haldar, J.P. et al. 2013. Linear transforms for Fourier data on the sphere: Application to high angular resolution diffusion MRI of the brain. NeuroImage 71, 233-247.
Hess, C.P. et al. 2006 Q-ball reconstruction of multimodal fiber orientations using the spherical harmonic basis. Magn. Reson. Med. 56, 104-117.
Jackson, J.I. et al. 1991. Selection of a convolution function for Fourier inversion using gridding. IEEE Trans. Med. Imag. 10, 473-478.

(Continued)

*Primary Examiner* — Clayton E Laballe
*Assistant Examiner* — Ruifeng Pu
(74) *Attorney, Agent, or Firm* — McDermott Will & Emery

(57) ABSTRACT

Samples of a Fourier transform of a signal may be received that are distributed in a generally spherically-shaped pattern on a surface of at least one sphere. The samples may be assembled to form a profile function having a domain that is a surface of at least one sphere. Information indicative of at least one property of the signal may be determined by applying a spherical linear transform to the profile function. The spherical linear transform may use more than just an equator of the profile function for each of multiple orientations.

19 Claims, 6 Drawing Sheets

(56) References Cited

OTHER PUBLICATIONS

Tournier, J.D. et al. 2008. Resolving crossing fibres using constrained spherical deconvolution: Validation using diffusion-weighted imaging phantom data. NeuroImage 42, 617-625.
Tuch, D.S. 2004. Q-ball imaging. Magn. Reson. Med. 52, 1358-1372.
Yeh, F.C. et al. 2010. Generalized q-sampling imaging. IEEE Trans. Med. Imag. 29, 1626-1635.
Brainsuite. 2013. Magnetic Resonance Image Analysis Tools. http://brainsuite.org/about/ Updates at least as early as Jul. 17, 2013. (Implements the Funk Radon Transform and the Funk Radon and Cosine Transform).
DIPY. 2008-2014. Diffusion Imaging in Python. DIPY Copyright 2008-2014. http://nipy.org/dipy/. (Free open source software that implements the Funk Radon Transform, spherical deconvolution, and constant solid angle q-ball imaging.).
MRtrix. 2011. MRtrix 0.2.11 Table of Contents, updated May 31, 2011. http://www.brain.org.au/software/mrtrix/index.html.(Implements spherical deconvolution.).
Trackvis Diffusion Toolkit. 2006-2010. TrackVis Diffusion Toolkit. http://trackvis.org/dtk/. Copyright 2006-2010. (Implements the Funk Radon Transform).
University College London. 1999-2009. UCL Camino Diffusion MRI Toolkit. http://cmic.cs.ucl.ac.uk/camino//index.php. (Implements the Funk Radon Transform.) Copyright 1999-2009.

* cited by examiner

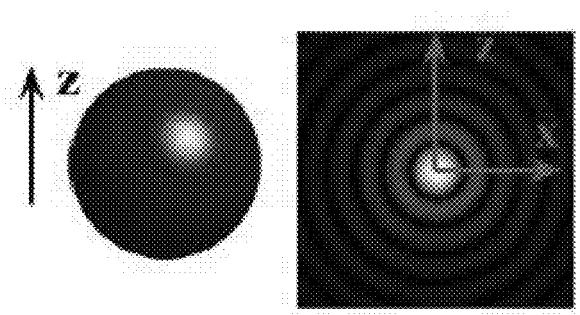
$G(t) = 1$
FIG. 1A
FIG. 1B
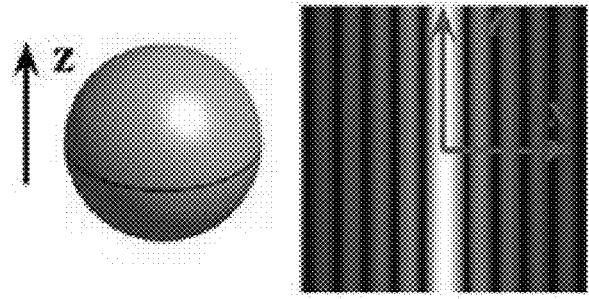
$G(t) = \delta(t - \xi)$
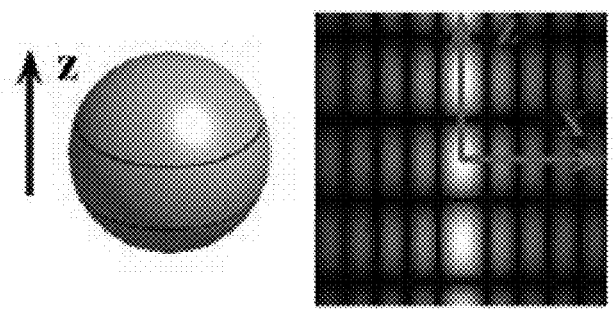
(c) $G(t) = \delta(t - \xi) + \delta(t + \xi)$
FIG. 1C

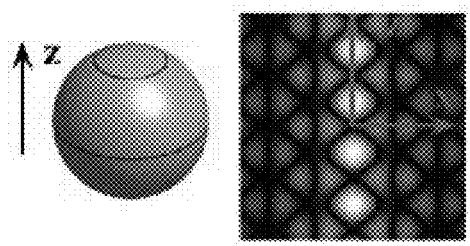
$\xi = 0.88\rho$
FIG. 2A
FIG. 2B
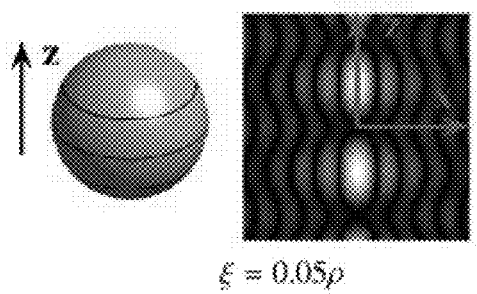
$\xi = 0.05\rho$
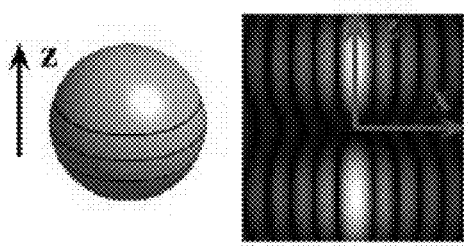
FIG. 2C
$\xi = 0.34\rho$
FIG. 2D
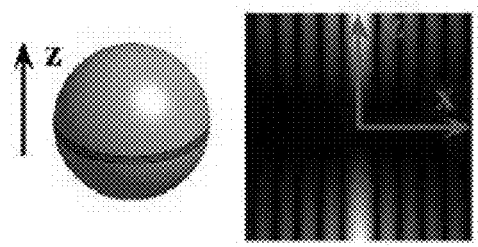
$\xi = 0.05\rho$

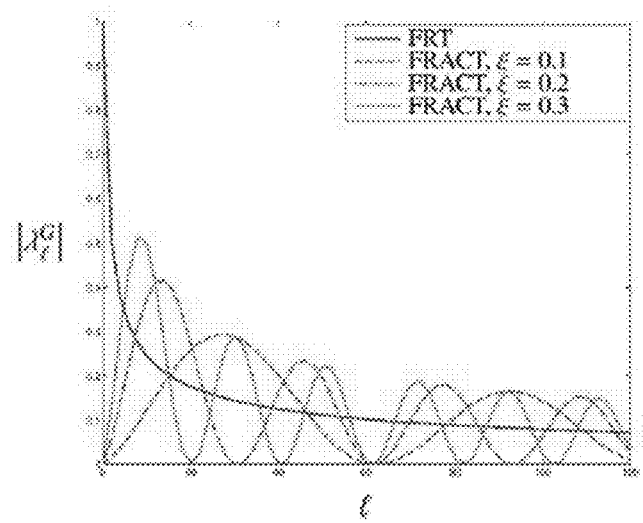
FIG. 3
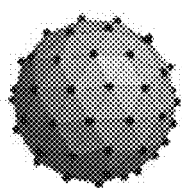
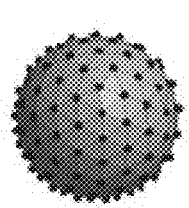
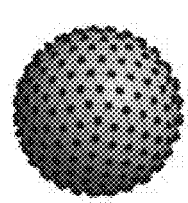
FIG. 4A     FIG. 4B     FIG. 4C
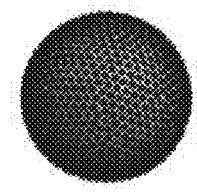
FIG. 4D

N=64  N=128  N=256  N=1024

N=64  N=128  N=256  N=1024

LINEAR TRANSFORM FOR DIFFUSION MRI

CROSS-REFERENCE TO RELATED APPLICATION

This application is based upon and claims priority to U.S. provisional patent application 61/757,619, entitled "LINEAR TRANSFORM APPROACH FOR PROCESSING DIFFUSION MAGNETIC RESONANCE IMAGING DATA," filed Jan. 28, 2013. This application is also related to U.S. provisional patent application 61/596,643, entitled "LINEAR TRANSFORM APPROACH FOR PROCESSING DIFFUSION MAGNETIC RESONANCE IMAGING DATA" filed Feb. 8, 2012. The entire content of each of these provisional applications is incorporated herein by reference.

STATEMENT REGARDING FEDERALLY SPONSORED RESEARCH

This invention was made with government support under Grant Nos. NIH-R01-EB010197 and NIH-P50-NS019632, awarded by the National Institutes of Health. The government has certain rights in the invention.

BACKGROUND

Technical Field

This disclosure relates to linear transforms of diffusion MRI data.

Description of Related Art

Transformations of Fourier data may be sampled on the surface of a sphere. E(q) may be a three-dimensional Fourier transform of an unknown real-valued function $f(x)$, with:

$$E(q) = \int_{\mathbb{R}^3} f(x) \exp(-i2\pi q^T x) dx. \quad (1)$$

E(q) may only be observed at points q from a 2-sphere of radius $\rho$, i.e., $q \in S_\rho^2$, where $S_\rho^2 = \{q \in \mathbb{R}^3 : \|q\|_{l_2} = \rho\}$.

Spherical Fourier sampling can provide an accurate model of a data acquisition procedure in high angular resolution magnetic resonance diffusion imaging (HARDI). A spherical linear transform method known as the Funk-Radon Transform (FRT) has been previously proposed by Tuch et al. in this context, see, Tuch, D. S., 2002, "Diffusion MRI of Complex Tissue Structure", Ph.D. thesis. Massachusetts Institute of Technology; Tuch, D. S., Reese, T. G., Wiegell, M. R., Wedeen, V. J., 2003, "Diffusion MRI of complex neural architecture", Neuron 40, 885-895; Tuch, D. S., 2004, "Q-ball imaging", Magn. Reson. Med. 52, 1358-1372. In particular, the FRT transforms the measured data according to $$R_G\{E(q)\}(u) = \int_{q \in S_\rho^2} E(q) G(u^T q) dq \quad (2),$$

where $G(u^T q) = \delta(u^T q)$ and $\delta(\cdot)$ denotes the Dirac delta function. In this notation, the delta function is being used to define a contour integral around the equator of $S_\rho^2$ that is perpendicular to u.

The FRT is useful in the context of HARDI data because it allows computation of an approximate diffusion orientation distribution function (ODF), which quantifies information about the amount of diffusion along any given orientation u. This diffusion orientation information can be valuable in the study of anisotropic structures like white matter fibers in the central nervous system (CNS), because the diffusion ODF for a given voxel is often similar in shape to the distribution of white matter fibers within that voxel, see, Seunarine, K. K., Alexander, D. C., 2009, "Multiple fibers: beyond the diffusion tensor, in: Johansen-Berg, H., Behrens, T. E. J. (Eds.), Diffusion MRI: from quantitative measurement to in vivo neuroanatomy", Academic Press. pp. 55-72; Assemlal, H. E., Tschumperlè, D., Brun, L., Siddiqi, K., 2011, "Recent advances in diffusion MRI modeling: Angular and radial reconstruction", Med. Image Anal. 15, 369-396. The combination of the FRT with HARDI data is also known as Q-ball imaging (QBI), see, Tuch, D. S., 2004, "Q-ball imaging", Magn. Reson. Med. 52, 1358-1372.

Many alternatives to the FRT have been proposed in recent years for estimating orientation information from the same kind of HARDI data, including multitensor models, see, Alexander, A. L., Hasan, K. M., Lazar, M., Tsuruda, J. S., Parker, D. L., 2001, "Analysis of partial volume effects in diffusion-tensor MRI", Magn. Reson. Med. 45, 770-780; Tuch, D. S., Reese, T. G., Wiegell, M. R., Makris, N., Belliveau, J. W., Wedeen, V. J., 2002, "High angular resolution diffusion imaging reveals intravoxel white matter fiber heterogeneity", Magn. Reson. Med. 48, 577-582; Hosey, T., Williams, G., Ansorge, R., 2005, "Inference of multiple fiber orientations in high angular resolution diffusion imaging", Magn. Reson. Med. 54, 1480-1489; Kreher, B. W., Schneider, J. F., Mader, I., Martin, E., Hennig, J., Il'yasov, K. A., 2005. "Multitensor approach for analysis and tracking of complex fiber configurations", Magn. Reson. Med. 54, 1216-1225; Peled, S., Friman, O., Jolesz, F., Westin, C. F., 2006, "Geometrically constrained two-tensor model for crossing tracts in DWI", Magn. Reson. Imag. 24, 1263-1270; Behrens, T. E. J., Johansen-Berg, H., Jbabdi, S., Rushworth, M. F. S., Woolrich, M. W., 2007, "Probabilistic diffusion tractography with multiple fibre orientations: What can we gain?", NeuroImage 34, 144-155; Jian, B., Vemuri, B. C., O"zarslan, E., Carney, P. R., Mareci, T. H., 2007, "A novel tensor distribution model for the diffusion-weighted MR signal", NeuroImage 37, 164-176; Ramirez-Manzanares, A., Rivera, M., Vemuri, B. C., Carney, P., Mareci, T., 2007, "Diffusion basis functions decomposition for estimating white matter intravoxel fiber geometry", IEEE Trans. Med. Imag. 26, 1091-1102; Pasternak, O., Assaf, Y., Intrator, N., Sochen, N., 2008, "Variational multipletensor fitting of fiber-ambiguous diffusion-weighted magnetic resonance imaging voxels", Magn. Reson. Imag. 26, 1133-1144; Melie-Garcia, L., Canales-Rodriguez, E. J., Aleman-Gomez, Y., Lin, C. P., Iturria-Medina, Y., Valdes-Hernandez, P. A., 2008, "A Bayesian framework to identify principal intravoxel diffusion profiles based on diffusion-weighted MR imaging", NeuroImage 42, 750-770; Leow, A. D., Zhu, S., Zhan, L., McMahon, K., de Zubicaray, G. I., Meredith, M., Wright, M. J., Toga, A. W., Thompson, P. M., 2009, "The tensor distribution function", Magn. Reson. Med. 61, 205-214; Tabelow, K., Voss, H. U., Polzehl, J., 2012, "Modeling the orientation distribution function by mixtures of angular central Gaussian distributions", J. Neurosci. Methods 203, 200-211, higher-order generalizations of tensor models, see Alexander, D. C., Barker, G. J., Arridge, S. R., 2002, "Detection and modeling of non-Gaussian apparent diffusion coeffcient profiles in human brain data", Magn. Reson. Med. 48, 331-340; Frank, L. R., 2002, "Characterization of anisotropy in high angular resolution diffusion-weighted MRI", Magn. Reson. Med. 47, 1083-1099; Özarslan, E., Mareci, T. H., 2003, "Generalized diffusion tensor imaging and analytical relationships between diffusion tensor imaging and high angular resolution diffusion imaging", Magn. Reson. Med. 50, 955-965; Liu, C., Bammer, R., Acar, B., Moseley, M. E., 2004, "Characterizing non-Gaussian diffusion by using generalized diffusion tensors", Magn. Reson.

Med. 51, 924-937; Schultz, T., Seidel, H. P., 2008, "Estimating crossing fibers: A tensor decomposition approach", IEEE Trans. Vis. Comput. Graphics 14, 1635-1646; Barmpoutis, A., Hwang, M. S., Howland, D., Forder, J. R., Vemuri, B. C., 2009, "Regularized positive-definite fourth order tensor field estimation from DWMRI", NeuroImage 45, S153-S162; Liu, C., Mang, S. C., Moseley, M. E., 2010, "In vivo generalized diffusion tensor imaging (GDTI) using higher-order tensors (HOT)", Magn. Reson. Med. 63, 243-252; Florack, L., Balmashnova, E., Astola, L., Brunenberg, E., 2010, "A new tensorial framework for single-shell high angular resolution diffusion imaging", J. Math. Imaging Vis. 38, 171-181, directional function modeling, see Kaden, E., Knösche, T. R., Anwander, A., 2007, "Parametric spherical deconvolution: Inferring anatomical connectivity using diffusion MR imaging", NeuroImage 37, 474-488; Rathi, Y., Michailovich, O., Shenton, M. E., Bouix, S., 2009, "Directional functions for orientation distribution estimation", Med. Image Anal. 13, 432-444; Rathi, Y., Malcolm, J. G., Michailovich, O., Westin, C. F., Shenton, M. E., Bouix, S., 2010, "Tensor kernels for simultaneous fiber model estimation and tractography", Magn. Reson. Med. 64, 138-148, spherical polar Fourier expansion, see Assemlal, H. E., Tschumperlè, D., Brun, L., 2009, "Efficient and robust computation of PDF features from diffusion MR signal", Med. Image Anal. 13, 715-729; Assemlal, H. E., Tschumperlè, D., Brun, L., Siddiqi, K., 2011, "Recent advances in diffusion MRI modeling: Angular and radial reconstruction", Med. Image Anal. 15, 369-396, independent component analysis, see Singh, M., Wong, C. W., 2010, "Independent component analysis-based multifiber streamline tractography of the human brain", Magn. Reson. Med. 64, 1676-1684, sparse spherical ridgelet modeling, see Michailovich, O., Rathi, Y., 2010, "On approximation of orientation distributions by means of spherical ridgelets", IEEE Trans. Image Process. 19, 461-477, diffusion circular spectrum mapping, see Zhan, W., Stein, E. A., Yang, Y., 2004, "Mapping the orientation of intravoxel crossing fibers based on the phase information of diffusion circular spectrum", NeuroImage 23, 1358-1369, deconvolution, see Tournier, J. D., Calamante, F., Connelly, A., 2007, "Robust determination of the fibre orientation distribution in diffusion MRI: Non-negativity constrained super-resolved spherical deconvolution", NeuroImage 35, 1459-1472; Anderson, A. W., 2005. "Measurement of fiber orientation distributions using high angular resolution diffusion imaging", Magn. Reson. Med. 54, 1194-1206; Descoteaux, M., Deriche, R., Knösche, T. R., Anwander, A., 2009, "Deterministic and probabilistic tractography based on complex fibre orientation distributions", IEEE Trans. Med. Imag. 28, 269-286; Patel, V., Shi, Y., Thompson, P. M., Toga, A. W., 2010, "Mesh-based spherical deconvolution: A flexible approach to reconstruction of non-negative fiber orientation distributions", NeuroImage 51, 1071-1081; Yeh, F. C., Wedeen, V. J., Tseng, W. Y. I., 2011, "Estimation of fiber orientation and spin density distribution by diffusion deconvolution", NeuroImage 55, 1054-1062; Reisert, M., Kiselev, V. G., 2011, "Fiber continuity: An anisotropic prior for ODF estimation", IEEE Trans. Med. Imag. 30, 1274-1283, the diffusion orientation transform, see Özarslan, E., Shepherd, T. M., Vemuri, B. C., Blackband, S. J., Mareci, T. H., 2006, "Resolution of complex tissue microarchitecture using the diffusion orientation transform (DOT)", NeuroImage 31, 1086-1103; Canales-Rodrìguez, E. J., Lin, C. P., Iturria-Medina, Y., Yeh, C. H., Cho, K. H., Melie-Garcìa, L., 2010, "Diffusion orientation transform revisited", NeuroImage 49, 1326-1339, estimation of persistent angular structure, see Jansons, K. M., Alexander, D. C., 2003, "Persistant angular structure: new insights from diffusion magnetic resonance imaging data", Inverse Probl. 19, 1031-1046, generalized q-sampling imaging, see Yeh, F. C., Wedeen, V. J., Tseng, W. Y. I., 2010, "Generalized q-sampling imaging", IEEE Trans. Med. Imag. 29, 1626-1635, and orientation estimation with solid angle considerations, see Tristàn-Vega, A., Westin, C. F., Aja-Fernàndez, S., 2009, "Estimation of fiber orientation probability density functions in high angular resolution diffusion imaging", NeuroImage 47, 638-650; Aganj, I., Lenglet, C., Sapiro, G., Yacoub, E., Ugurbil, K., Harel, N., 2010. "Reconstruction of the orientation distribution function in single-and multipleshell q-ball imaging within constant solid angle", Magn. Reson. Med. 64, 554-566; Tristàn-Vega, A., Westin, C. F., Aja-Fernàndez, S., 2010, "A new methodology for the estimation of fiber populations in the white matter of the brain with the Funk-Radon transform", NeuroImage 49, 1301-1315. However, the FRT has a unique combination of useful characteristics: it does not require a strict parametric model of the diffusion signal, it is linear and its theoretical characteristics can be explored analytically, and it can be computed very quickly using efficient algorithms, see Anderson, A. W., 2005, "Measurement of fiber orientation distributions using high angular resolution diffusion imaging", Magn. Reson. Med. 54, 1194-1206; Hess, C. P., Mukherjee, P., Han, E. T., Xu, D., Vigneron, D. B., 2006, "Q-ball reconstruction of multimodal fiber orientations using the spherical harmonic basis", Magn. Reson. Med. 56, 104-117; Descoteaux, M., Angelino, E., Fitzgibbons, S., Deriche, R., 2007, "Regularized, fast, and robust analytical Q-ball imaging", Magn. Reson. Med. 58, 497-510; Kaden, E., Kruggel, F., 2011, "A reproducing kernel Hilbert space approach for Q-ball imaging", IEEE Trans. Med. Imag. 30, 1877-1886.

Despite these FRT-based orientation, estimates can have lower resolution/accuracy relative to some of the alternative processing methods, see, Alexander, D. C., 2005, "Multiple-fiber reconstruction algorithms for diffusion MRI", Ann. NY Acad. Sci. 1064, 113-133; Anderson, A. W., 2005. "Measurement of fiber orientation distributions using high angular resolution diffusion imaging", Magn. Reson. Med. 54, 1194-1206; Jian, B., Vemuri, B. C., Özarslan, E., Carney, P. R., Mareci, T. H., 2007. "A novel tensor distribution model for the diffusion-weighted MR signal", NeuroImage 37, 164-176; Ramirez-Manzanares, A., Rivera, M., Vemuri, B. C., Carney, P., Mareci, T., 2007, "Diffusion basis functions decomposition for estimating white matter intravoxel fiber geometry", IEEE Trans. Med. Imag. 26, 1091-1102; Schultz, T., Seidel, H. P., 2008, "Estimating crossing fibers: A tensor decomposition approach", IEEE Trans. Vis. Comput. Graphics 14, 1635-1646; Barmpoutis, A., Hwang, M. S., Howland, D., Forder, J. R., Vemuri, B. C., 2009, "Regularized positive-definite fourth order tensor field estimation from DWMRI", NeuroImage 45, S153-S162; Descoteaux, M., Deriche, R., Knösche, T. R., Anwander, A., 2009, "Deterministic and probabilistic tractography based on complex fibre orientation distributions", IEEE Trans. Med. Imag. 28, 269-286; Tournier, J. D., Yeh, C. H., Calamante, F., Cho, K. H., Connelly, A., Lin, C. P., 2008, "Resolving crossing fibres using constrained spherical deconvolution: Validation using diffusion-weighted imaging phantom data", NeuroImage 42, 617-625; Rathi, Y., Michailovich, O., Shenton, M. E., Bouix, S., 2009. "Directional functions for orientation distribution estimation", Med. Image Anal. 13, 432-444; Aganj, I., Lenglet, C., Sapiro, G., Yacoub, E., Ugurbil, K., Harel, N., 2010, "Reconstruction of the orientation distribution function in single-and multipleshell

*q-ball imaging within constant solid angle*", Magn. Reson. Med. 64, 554-566; Tristàn-Vega, A., Westin, C. F., Aja-Fernàndez, S., 2009. "*Estimation of fiber orientation probability density functions in high angular resolution diffusion imaging*", NeuroImage 47, 638-650; Michailovich, O., Rathi, Y., 2010, "*On approximation of orientation distributions by means of spherical ridgelets*", IEEE Trans. Image Process, 19, 461-477; Yeh, F. C., Wedeen, V. J., Tseng, W. Y. I., 2011, "*Estimation of fiber orientation and spin density distribution by diffusion deconvolution*", NeuroImage 55, 1054-1062; Canales-Rodrìguez, E. J., Lin, C. P., Iturria-Medina, Y., Yeh, C. H., Cho, K. H., Melie-Garcìa, L., 2010. "*Diffusion orientation transform revisited*", NeuroImage 49, 1326-1339; Yeh, F. C., Wedeen, V. J., Tseng, W. Y. I., 2010, "*Generalized q-sampling imaging*", IEEE Trans. Med. Imag. 29, 1626-1635; Tristàn-Vega, A., Westin, C. F., Aja-Fernàndez, S., 2010, "*A new methodology for the estimation of fiber populations in the white matter of the brain with the Funk-Radon transform*", NeuroImage 49, 1301-1315; Assemlal, H. E., Tschumperlè, D., Brun, L., Siddiqi, K., 2011, "*Recent advances in diffusion MRI modeling: Angular and radial reconstruction*", Med. Image Anal. 15, 369-396, partly because the approach is based on a sub-optimal definition of the ODF, see Barnett, A., 2009, "*Theory of q-ball imaging redux: Implications for fiber tracking*", Magn. Reson. Med. 62, 910-923; Aganj, I., Lenglet, C., Sapiro, G., Yacoub, E., Ugurbil, K., Harel, N., 2010, "*Reconstruction of the orientation distribution function in single- and multipleshell q-ball imaging within constant solid angle*", Magn. Reson. Med. 64, 554-566; Tristàn-Vega, A., Westin, C. F., Aja-Fernàndez, S., 2009, "*Estimation of fiber orientation probability density functions in high angular resolution diffusion imaging*", NeuroImage 47, 638-650.

Diffusion MRI and the Funk-Radon Transform

Diffusion MRI Basics

The statistical characteristics of molecular diffusion within a single MR imaging voxel may be coarsely summarized using a probability density function $P(x,\Delta)$ known as the ensemble average diffusion propagator (EAP), see Callaghan, P. T., 1991, "*Principles of Nuclear Magnetic Resonance Microscopy*" Clarendon Press, Oxford. The EAP quantifies the average probability that a water molecule, undergoing a random walk over a time period of length $\Delta$, will be found at a spatial displacement of $x \in \mathbb{R}^3$ relative to its starting position. Under the assumptions of pure diffusion and that the system is at thermal equilibrium, the EAP may be symmetric (i.e., $P(x,\Delta)=P(-x, \Delta)$) and have zero-mean. Under the q-space formalism, see Callaghan, P. T., 1991, "*Principles of Nuclear Magnetic Resonance Microscopy*" Clarendon Press, Oxford, the ideal measured DW-MRI data may be modeled as (1), where the q-space function $E(q)$ corresponds to the signal observed from the MR scanner as a function of diffusion gradient parameters q, and $f(x) \propto P(x, \Delta)$.

In practice, the diffusion signal $E(q)$ may be measured over a finite set of different q values, and a variety of different q-space sampling schemes have been proposed. One approach is to densely sample q-space. For example, assuming the EAP is support-limited and the sampling density satisfies the Nyquist criterion, then reconstruction of the full EAP is possible via Fourier inversion, see Wedeen, V. J., Hagmann, P., Tseng, W. Y. I., Reese, T. G., Weisskoff, R. M., 2005. "*Mapping complex tissue architecture with diffusion spectrum magnetic resonance imaging*", Magn. Reson. Med. 54, 1377-1386. However, this kind of encoding can be demanding on MR hardware, and can also be time consuming since experiment time is proportional to the number of samples. At the other extreme, parametric models for the EAP can be used to reduce q-space sampling requirements significantly. For example, the conventional diffusion tensor imaging (DTI) model, see Basser, P. J., Mattiello, J., LeBihan, D., 1994, "*Estimation of the effective self-diffusion tensor from the NMR spin echo*", J. Magn. Reson. B 103, 247-254, is equivalent to modeling the EAP as a zero-mean Gaussian distribution, and estimation of the corresponding 3×3 positive semidefinite covariance matrix can be achieved with as few as 7 different q-space samples. However, a simple Gaussian model may be insufficient to accurately model diffusion in complex biological tissues. In the CNS, this may be due in part to the fact that the simple Gaussian model can have at most one dominant orientation, and thus may be incapable of representing the EAPs that are observed when a single voxel contains partial volume contributions from multiple crossing white matter fiber bundles.

HARDI sampling, in which diffusion data is sampled densely on the surface of a sphere, may enable a more reasonable balance between data acquisition speed/complexity and the capability to resolve crossing fibers. It has been shown that approaches using HARDI sampling can have only incrementally lower performance compared to Nyquist-rate Fourier encoding, but have significantly enhanced performance over DTI, see Kuo, L. W., Chen, J. H., Wedeen, V. J., Tseng, W. Y. I., 2008. "*Optimization of diffusion spectrum imaging and q-ball imaging on clinical MRI system*", NeuroImage 41, 7-18; Zhan, W., Yang, Y., 2006, "*How accurately can the diffusion profiles indicate multiple fiber orientations? a study on general fiber crossings in diffusion*", MRI. J. Magn. Reson. 183, 193-202.

Orientation Distribution Functions and the Funk-Radon Transform

An important objective in DW-MRI may be to derive fiber orientation information from HARDI data, and there may be different ways to define an ODF to quantify the orientations associated with an EAP. In QBI, see Tuch, D. S., 2004, "*Q-ball imaging*", Magn. Reson. Med. 52, 1358-1372, an ideal ODF was defined as $$ODF_{QBI}(u) = \int_0^\infty f(\alpha u) d\alpha \qquad (3)$$

$$= \frac{1}{2}\int_{-\infty}^\infty f(\alpha u) d\alpha$$

$$= \frac{1}{2}\int_{-\infty}^\infty \tilde{f}_u(0, 0, z) dz$$

for orientation vectors $u \in S_1^2$. The ODF definition from Tuch, D. S., 2004, "*Q-ball imaging*", Magn. Reson. Med. 52, 1358-1372 included an additional dimensionless normalization constant, which is not included here to simplify notation.

The function $\tilde{f}_u(\cdot)$ expresses $f(\cdot)$ in a rotated coordinate system in which the orientation vector u is parallel to the z-axis. This definition of the ODF computes radial projections of the EAP, which Tuch showed can be approximated by the FRT. In particular, it can be verified that the FRT satisfies $$\int_{\mathbb{R}^3} E(q)\delta(u^T q) dq = \rho \int_0^{2\pi} \tilde{E}_u(\rho\cos\theta, \rho\sin\theta, 0) d\theta \qquad (4)$$

$$= 2\pi\rho \int\int\int_{\mathbb{R}^3} \tilde{f}_u(x, y, z) J_0(2\pi\rho\sqrt{x^2+y^2}) dx\, dy\, dz$$

where $\tilde{E}_u(\bullet)$ is the coordinate-rotated version of $E(\bullet)$ (cf. $\tilde{f}_u(\bullet)$ and $f(\bullet)$), and $J_0(\bullet)$ is the zeroth-order Bessel function of the first kind. Given that $J_0(\bullet)$ has most of its energy concentrated at the origin, (4) can be viewed as a coarse approximation of (3), with the approximation quality improving for larger values of the sampling radius ρ.

While the QBI definition of the ODF has been used, an improved ODF definition may be given by Wedeen, V. J., Hagmann, P., Tseng, W. Y. I., Reese, T. G., Weisskoff, R. M., 2005, "Mapping complex tissue architecture with diffusion spectrum magnetic resonance Imaging", Magn. Reson. Med. 54, 1377-1386; Barnett, A., 2009, "*Theory of q-ball imaging redux: Implications for fiber tracking*", Magn. Reson. Med. 62, 910-923; Aganj, I., Lenglet, C., Sapiro, G., Yacoub, E., Ugurbil, K., Harel, N., 2010, "*Reconstruction of the orientation distribution function in single- and multipleshell q-ball imaging within constant solid angle*", Magn. Reson. Med. 64, 554-566; Tristàn-Vega, A., Westin, C. F., Aja-Fernàndez, S., 2009. "*Estimation of fiber orientation probability density functions in high angular resolution diffusion imaging*", NeuroImage 47, 638-650

$$ODF(u) = \int_0^\infty f(\alpha u)\alpha^2 \, d\alpha \quad (5)$$

$$= \frac{1}{2}\int_{-\infty}^\infty f(\alpha u)\alpha^2 \, d\alpha$$

$$= \frac{1}{2}\int_{-\infty}^\infty \tilde{f}_u(0, 0, z)z^2 \, dz.$$

Physically, this may correspond to radial integration of the EAP over a cone of constant solid angle, and differs from (3) by including the appropriate volume element for radial integration in spherical coordinates. And unlike (3), this ODF may be proportional to the probability distribution that would be obtained by marginalizing over the radial component of the EAP. While (5) may have better theoretical and practical characteristics than the QBI ODF, see Barnett, A., 2009, "*Theory of q-ball imaging redux: Implications for fiber tracking*", Magn. Reson. Med. 62, 910-923; Aganj, I., Lenglet, C., Sapiro, G., Yacoub, E., Ugurbil, K., Harel, N., 2010, "*Reconstruction of the orientation distribution function in single-and multipleshell q-ball imaging within constant solid angle*", Magn. Reson. Med. 64, 554-566; Tristàn-Vega, A., Westin, C. F., Aja-Fernàndez, S., 2009. "*Estimation of fiber orientation probability density functions in high angular resolution diffusion imaging*", NeuroImage 47, 638-650; Assemlal, H. E., Tschumperlè, D., Brun, L., Siddiqi, K., 2011, "*Recent advances in diffusion MRI modeling: Angular and radial reconstruction*", Med. Image Anal. 15, 369-396, existing methods to compute (5) from sampled data may have either required additional modeling assumptions, see; Tristàn-Vega, A., Westin, C. F., Aja-Fernàndez, S., 2009. "*Estimation of fiber orientation probability density functions in high angular resolution diffusion imaging*", NeuroImage 47, 638-650; Aganj, I., Lenglet, C., Sapiro, G., Yacoub, E., Ugurbil, K., Harel, N., 2010, "*Reconstruction of the orientation distribution function in single- and multipleshell q-ball imaging within constant solid angle*", Magn. Reson. Med. 64, 554-566; Tristàn-Vega, A., Westin, C. F., Aja-Fernàndez, S., 2010, "*A new methodology for the estimation of fiber populations in the white matter of the brain with the Funk-Radon transform*", NeuroImage 49, 1301-1315; Canales-Rodrìguez, E. J., Lin, C. P., Iturria-Medina, Y., Yeh, C. H., Cho, K. H., Melie-Garcìa, L., 2010, "*Diffusion orientation transform revisited*", NeuroImage 49, 1326-1339; Assemlal, H. E., Tschumperlè, D., Brun, L., Siddiqi, K., 2011. "*Recent advances in diffusion MRI modeling: Angular and radial reconstruction*", Med. Image Anal. 15, 369-396, the application of nonlinear operators (e.g., logarithmic-transformations) to the diffusion data, see Tristàn-Vega, A., Westin, C. F., Aja-Fernàndez, S., 2009. "*Estimation of fiber orientation probability density functions in high angular resolution diffusion imaging*", NeuroImage 47, 638-650; Aganj, I., Lenglet, C., Sapiro, G., Yacoub, E., Ugurbil, K., Harel, N., 2010, "*Reconstruction of the orientation distribution function in single- and multipleshell q-ball imaging within constant solid angle*", Magn. Reson. Med. 64, 554-566; Tristàn-Vega, A., Westin, C. F., Aja-Fernàndez, S., 2010, "*A new methodology for the estimation of fiber populations in the white matter of the brain with the Funk-Radon transform*", NeuroImage 49, 1301-1315; Canales-Rodrìguez, E. J., Lin, C. P., Iturria-Medina, Y., Yeh, C. H., Cho, K. H., Melie-Garcìa, L., 2010, "*Diffusion orientation transform revisited*", NeuroImage 49, 1326-1339, or more complicated non-spherical q-space sampling, see Wedeen, V. J., Hagmann, P., Tseng, W. Y. I., Reese, T. G., Weisskoff, R. M., 2005, "*Mapping complex tissue architecture with diffusion spectrum magnetic resonance Imaging*", Magn. Reson. Med. 54, 1377-1386; Canales-Rodrìguez, E. J., Melie-Garcìa, L., Iturria-Medina, Y., 2009, "*Mathematical description of q-space in spherical coordinates: Exact q-ball imaging*", Magn. Reson. Med. 61, 1350-1367.

SUMMARY

Samples of a Fourier transform of a signal may be received that are distributed in a generally spherically-shaped pattern on a surface of at least one sphere. The samples may be assembled to form a profile function having a domain that is a surface of at least one sphere. Information indicative of at least one property of the signal may be determined by applying a spherical linear transform to the profile function. The spherical linear transform may use more than just an equator of the profile function for each of multiple orientations.

The samples of a Fourier transform may include diffusion MRI data, and the signal may be a diffusion function.

How accurately the information indicates the at least one property may be determined by calculating a response function of the spherical linear transform.

The calculated response function may account for finite sampling of the sphere.

The calculating the response function may use re-gridding and a Fast Fourier Transform.

The spherical linear transform may be selected based on an anticipated accuracy of the information that results from application of the selected spherical linear transform.

The spherical linear transform may be evaluated by using a computational algorithm based on a spherical harmonic representation of a transform kernel.

At least one determined property of the diffusion function may include a constant solid-angle orientation distribution function.

The spherical linear transform may include a Funk-Radon and Cosine Transform or a weighted sum or integral of multiple Funk-Radon and Cosine Transforms.

The determining the at least one property of the diffusion function may include augmenting the spherical linear transform with nonspherical or nonlinear processing.

At least one determined property of the signal may include moments or weighted moments of the signal or its radial projections.

An MRI system may include an MRI machine that generates diffusion MRI data, a computer system; and a computer-readable storage medium containing a program of instructions that cause the computer system running the program of instructions to perform one, all, or any combination of the functions recited above.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIGS. 1A-1C illustrate various function pairs.

FIGS. 2A-2D illustrate FRACT for different choices of $\xi$.

FIG. 3 illustrates magnitudes of spherical harmonic eigenvalues for different transforms as a function of spherical harmonic degree.

FIGS. 4A-4D illustrate sampling patterns with different numbers N of total measurements.

DETAILED DESCRIPTION OF ILLUSTRATIVE EMBODIMENTS

Figures 5A, 5B, 5C, 5D:
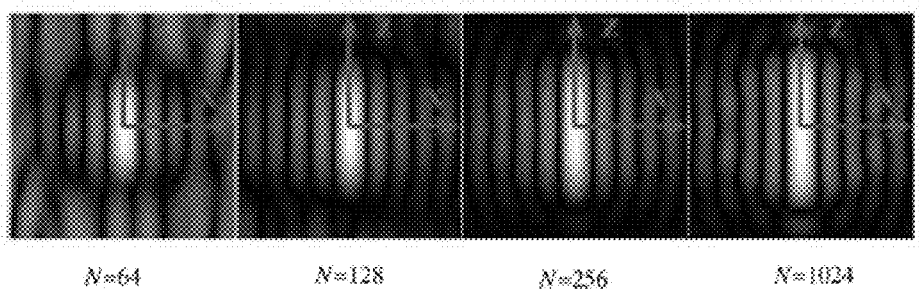
FIGS. 5A-5H illustrate images showing the magnitude of $\tilde{g}_u(x, 0, z)$ in the x-z plane for a FRT in the presence of finite sampling of the sphere and truncation of the spherical harmonic series.
Figures 5E, 5F, 5G, 5H:
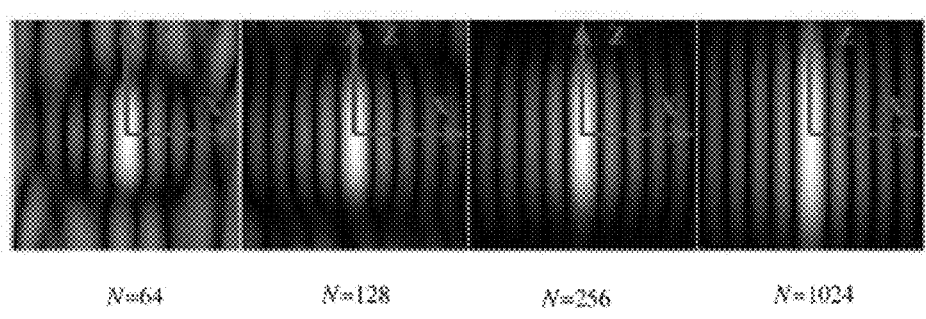
Figures 6A, 6B, 6C, 6D:
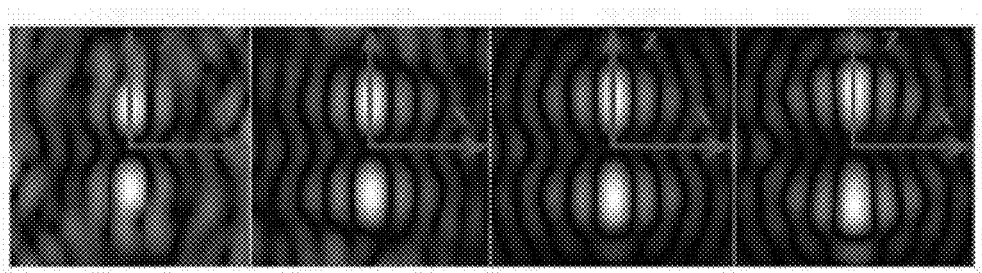
FIGS. 6A-6H illustrate images showing the magnitude of $\tilde{g}_u(x, 0, z)$ in the x-z plane for a FRACT with parameter $\xi = 0.51\rho$, in the presence of finite sampling of the sphere and truncation of the spherical harmonic series.
Figures 6E, 6F, 6G, 6H:
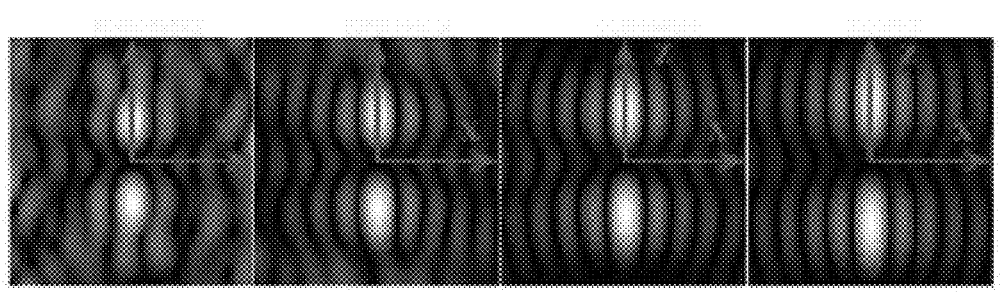

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Linear Transforms of the Fourier 2-Sphere

For any absolutely integrable function G(t), the action of equation (2) above applied to noiseless data can be expressed as $$R_G\{E(q)\}(u) = \int_{\mathbb{R}^3} \left(\int_{\mathbb{R}^3} f(x)\exp(-i2\pi q^T x)dx\right)G(u^T q)dq \quad (6)$$
$$= \int_{\mathbb{R}^3} f(x)\left(\int_{\mathbb{R}^3} G(u^T)\exp(-i2\pi q^T x)dq\right)dx$$
$$= \int_{\mathbb{R}^3} f(x)g(u,x)dx,$$

where $$g(u,x) \equiv \int_{\mathbb{R}^3} G(u^T q)\exp(-i2\pi q^T x)dq. \quad (7)$$

The response function g (u,x) can be interpreted like a point-spread function, and through (6), provides a direct relationship between the transformed data, the EAP, and the kernel function G(•).

Using the same unitary coordinate transformation as before to define $\tilde{g}_u(\bullet)$ in terms of g(u,•), (7) may be expressed in rotated coordinates as $$\tilde{g}_u(x,y,z) = \int_{-\rho}^{\rho} G(\tau)B(x,y,\tau)\exp(-i2\pi\tau z)d\tau, \quad (8)$$

with $$B(x,y,\tau) = 2\pi\rho J_0(2\pi\sqrt{\rho^2-\tau^2}\sqrt{x^2+y^2}). \quad (9)$$

Derivation of (8) and (9)

The surface integral in (7) can be expressed in spherical coordinates as in (24). When u is aligned with the z-axis, this integral reduces to (25). Under the change of variables $\tau = \rho \cos\varphi$, and noting that $\rho \sin\varphi = \sqrt{\rho^2-\tau^2}$, (25) can be expressed as (26), which matches the expressions in (8) and (9).

$$\int_0^\pi \int_0^{2\pi} (u_x\rho\cos\theta\sin\phi + u_y\rho\sin\theta\sin\phi + u_z\rho\cos\phi) \cdot \quad (24)$$
$$\exp(-i2\pi(x\rho\cos\theta\sin\phi + y\rho\sin\theta\sin\phi + z\rho\cos\phi))\rho^2\sin\phi\, d\theta\, d\phi.$$

$$\int_0^\pi \int_0^{2\pi} G(\rho\cos\phi) \quad (25)$$
$$\exp(-i2\pi(x\rho\cos\theta\sin\phi + y\rho\sin\theta\sin\phi + z\rho\cos\phi))\rho^2\sin\phi\, d\theta\, d\phi.$$

$$\int_{-\rho}^{\rho}\int_0^{2\pi} G(\tau)\exp\left(-i2\pi\left(x\sqrt{\rho^2-\tau^2}\cos\theta + y\sqrt{\rho^2-\tau^2}\sin\theta + z\tau\right)\right) \quad (26)$$
$$\rho d\theta\, d\tau = \rho\int_{-\rho}^{\rho} G(\tau)\exp(-i2\pi z\tau)$$
$$\int_0^{2\pi}\exp\left(-i2\pi\left(x\sqrt{\rho^2-\tau^2}\cos\theta + y\sqrt{\rho^2-\tau^2}\sin\theta\right)\right)d\theta\, d\tau =$$
$$2\pi\rho\int_{-\rho}^{\rho} G(\tau)\exp(-i2\pi z\tau)J_0\left(2\pi\sqrt{\rho^2-\tau^2}\sqrt{x^2+y^2}\right)d\tau,$$

TABLE 1

Some Transform Kernel Pairs

| Kernel Function G(t) | Corresponding $\tilde{g}_u(x, y, z)$ | Notes |
|---|---|---|
| 1 | $4\pi\text{sinc}(2\rho(x^2 + y^2 + z^2))$ | See Bracewell (2000) and FIG. 1(a) |
| $\delta(t - \xi)$ with fixed parameter $\xi \in [-\rho, \rho]$ | $2\pi\rho J_0(2\pi\sqrt{\rho^2-\xi^2}\sqrt{x^2+y^2})\exp(-i2\pi\xi z)$ | $\xi = 0$ yields the FRT, see FIG. 1(b) |
| $\delta(t - \xi) + \delta(t + \xi)$ with fixed parameter $\xi \in [-\rho, \rho]$ | $4\pi\rho J_0(2\pi\sqrt{\rho^2-\xi^2}\sqrt{x^2+y^2})\cos(2\pi\xi z)$ | See FIG. 1(c) |

FIG. 1 illustrates the function pairs listed in Table 1. In each subfigure, the left image shows $G(u^T q)$ for q on the sphere, and the right image shows the magnitude of $\tilde{g}_u(x, 0, z)$ in the x-z plane, both for the case where u is oriented along the z-axis. Note that $\tilde{g}_u(x, y, z)$ is axially symmetric about the z-axis. The function pairs are shown with (b) $\xi=0$ and (c) $\xi=0.36\rho$.

As can be seen from (8) and (9), the functions $\tilde{g}_u(x, y, z)$ resulting from (2) can be expressed as a linear combination of Bessel functions modulated by complex sinusoids and possess axial symmetry about the z-axis. A few important $\tilde{q}_u(x, y, z)$ and $G(t)$ pairs are listed in Table 1 and the corresponding $G(u^T q)$ and $\tilde{g}_u(x, y, z)$ are illustrated in FIG. 1. While the transform kernels involving delta functions may not be absolutely integrable, the contour integrals they imply can still be well defined.

Since $f(x)$ may be real-valued and symmetric, attention may be restricted to functions $g(u,x)$ that are also real-valued and symmetric with respect to x. In turn, this may restrict attention to real-valued and symmetric kernel functions $G(\bullet)$, so that all of the interesting $g(u,x)$ that can be obtained with (2) can equivalently be expressed as linear combinations of cosine-modulated Bessel functions in the form of the last entry of Table 1.

Fast Computation

The previous subsection described a class of interesting transforms that can be obtained from (2). In this subsection, it will be shows that the computation of this transform can be performed easily by making use of spherical harmonics. The spherical harmonics form an orthonormal basis for $S_1^2$, and are frequently defined as, see Descoteaux, M., Angelino, E., Fitzgibbons, S., Deriche, R., 2007, "*Regularized, fast, and robust analytical Q-ball imaging*", Magn. Reson. Med. 58, 497-510

$$Y_\ell^m(u) = \sqrt{\frac{2\ell+1}{4\pi} \frac{(\ell-m)!}{(\ell+m)!}} P_\ell^m(\cos\theta)\exp(im\phi), \quad (10)$$

where the harmonic degree $l=0, 1, \ldots, \infty$, and the harmonic order $m=-l, \ldots, 0, \ldots, l$. In this expression, $\theta\in[0,\pi]$ is the polar angle and $\varphi\in[0,2\pi]$ is the azimuthal angle for the vector u, and $P_l^m(\bullet)$ is the associated Legendre function of degree l and order m.

Use of spherical harmonic representations is common in the HARDI literature, partly due to the observation that the spherical harmonics are eigenfunctions of the FRT, see Anderson, A. W., 2005, "*Measurement of fiber orientation distributions using high angular resolution diffusion imaging*", Magn. Reson. Med. 54, 1194-1206; Hess, C. P., Mukherjee, P., Han, E. T., Xu, D., Vigneron, D. B., 2006, "*Q-ball reconstruction of multimodal fiber orientations using the spherical harmonic basis*", Magn. Reson. Med. 56, 104-117; Descoteaux, M., Angelino, E., Fitzgibbons, S., Deriche, R., 2007, "*Regularized, fast, and robust analytical Q-ball imaging*", Magn. Reson. Med. 58, 497-510; Kaden, E., Kruggel, F., 2011. "*A reproducing kernel Hilbert space approach for Q-ball imaging*", IEEE Trans. Med. Imag. 30, 1877-1886. Thus, if $E(q)$ is represented through its coefficients $\{c_{lm}\}$ in the spherical harmonic basis as $$E(q) = \sum_{\ell=0}^{\infty} \sum_{m=-\ell}^{\ell} c_{\ell m} Y_\ell^m(q), \quad (11)$$

then the FRT may be computed through simple rescaling of each spherical harmonic coefficient by the corresponding eigenvalue. While there are several methods of deriving the eigenfunction relationship for the FRT, see Descoteaux, M., Angelino, E., Fitzgibbons, S., Deriche, R., 2007, "*Regularized, fast, and robust analytical Q-ball imaging*", Magn. Reson. Med. 58, 497-510, the Funk-Hecke theorem has been used as the basis for their derivations.

The Funk-Hecke theorem indicates that spherical harmonics will be eigenfunctions of (2) for most choices of the transform kernel $G(t)$:

Theorem (Funk-Hecke, adapted from Freeden, W., Schreiner, M., 2009, "*Spherical Functions of Mathematical Geosciences: A Scalar, Vectorial, and Tensorial Setup*", Advances in Geophysical and Environmental Mechanics and Mathematics, Springer, New York): Suppose that $G(t)$ is absolutely integrable. Then for any $u \in S_1^2$, $$\int_{q \in S_\rho^2} G(u^T q) Y_l^m(q) dq = \lambda_l^G Y_l^m(u), \quad (12)$$

where the eigenvalue $\lambda_l^G$ is given by $$\lambda_l^G = 2\pi\rho^2 \int_{-1}^{1} P_l(t) G(\rho t) dt. \quad (13)$$

$P_l(t)$ in (13) is the Legendre polynomial of degree l.

It follows from this theorem that (2) can be equivalently written for $G(t) \in \mathcal{L}_1([-\rho, \rho])$ in terms of the spherical harmonic coefficients $\{c_{lm}\}$ as $$R_G\{E(q)\}(u) = \sum_{\ell=0}^{\infty} \lambda_\ell^G \sum_{m=-\ell}^{\ell} c_{\ell m} Y_\ell^m(u). \quad (14)$$

$G(t)=\delta(t-\xi)$ (e.g., as used by the FRT) may not be absolutely integrable. However, an eigenfunction relationship is also valid for the circular contour integrals implied by these transform kernels. In particular, the eigenvalues corresponding to the transform kernel $G(t)=\delta(t-\xi)$ are $$\lambda_l^G = 2\pi\rho P_l(\xi/\rho). \quad (15)$$

This result was proven for $\xi=0$ in Anderson, A. W., 2005, "*Measurement of fiber orientation distributions using high angular resolution diffusion imaging*", Magn. Reson. Med. 54, 1194-1206; Hess, C. P., Mukherjee, P., Han, E. T., Xu, D., Vigneron, D. B., 2006. "*Q-ball reconstruction of multimodal fiber orientations using the spherical harmonic basis*", Magn. Reson. Med. 56, 104-117; Descoteaux, M., Angelino, E., Fitzgibbons, S., Deriche, R., 2007, "*Regularized, fast, and robust analytical Q-ball imaging*", Magn. Reson. Med. 58, 497-510, for use with the FRT, and the proof technique of Descoteaux, M., Angelino, E., Fitzgibbons, S., Deriche, R., 2007, "*Regularized, fast, and robust analytical Q-ball imaging*", Magn. Reson. Med. 58, 497-510 extends in a straightforward manner for nonzero $\xi$.

The Funk-Radon and Cosine Transform

Based on the general class of transforms introduced in the previous section, the FRACT may be defined by the transform kernel $$G(t) = \frac{1}{8\pi^3 \xi^2 \rho}(2\delta(t) - \delta(t+\xi) - \delta(t-\xi)), \quad (16)$$

for some $\xi$ with $0<\xi<\rho$. The results of the previous section imply that the FRACT has $$\tilde{g}_u(x, y, z) = \frac{1}{2\pi^2\xi^2} J_0(2\pi\rho\sqrt{x^2+y^2}) - \qquad (17)$$

$$\frac{1}{2\pi^2\xi^2} J_0(2\pi\sqrt{\rho^2-\xi^2}\sqrt{x^2+y^2})\cos(2\pi\xi z),$$

with spherical harmonic eigenvalues given by $$\lambda_\ell^G = \frac{1}{4\pi^2\xi^2}(2P_\ell(0) - P_\ell(\xi/\rho) - P_\ell(-\xi/\rho)). \qquad (18)$$

A characteristic of the FRACT is the behavior of $\tilde{g}_u(0,0,z)$ as a function of z. In particular, for small values of $\xi z$, the FRACT satisfies $$\tilde{g}_u(0, 0, z) = \frac{1}{2\pi^2\xi^2}(1 - \cos(2\pi\xi z)) \qquad (19)$$
$$\approx z^2,$$

where the approximation is obtained by neglecting the higher-order terms in the Taylor series expansion of the cosine. Substituting (19) into (6), the FRACT can be used to compute an approximation of the ODF defined in (5), similar to the way in which the FRT was used to compute an approximation of the alternative ODF defined in (3). It should also be noted that, as with the FRT, the signal leakage associated with the finite width of the Bessel functions in the response function of the FRACT will diminish with increasing sampling radius $\rho$. However, using very large values of $\rho$ places significant demands on the gradient system of an MR scanner, and that the SNR of E(q) typically decays exponentially as $\rho$ increases. Also, while the relationship between (19) and (5) has no explicit dependence on $\rho$, the interval over which (19) accurately approximates (5) will diminish as $\rho$ increases if $\xi$ is chosen in proportion to $\rho$.

For a given $\rho$, the FRACT has a single parameter $\xi$ that controls its behavior. The FRACT is not very sensitive to small variations in $\xi$, due to the fact that the FRACT spherical harmonic eigenvalues in (18) vary smoothly as a function of $\xi$ because of the smoothness of the Legendre polynomials, though larger changes in $\xi$ can lead to FRACTs with different characteristics. Examples of $G(u^T q)$ and $\tilde{g}_u(x, y, z)$ for different choices of $\xi$ are illustrated in FIG. 2.

FIG. 2 illustrates FRACT for different choices of $\xi$. In each subfigure, the left image shows $G(u^T q)$ for q on the sphere, and the right image shows the magnitude of $\tilde{g}_u(x, 0, z)$ in the x-z plane, both for the case where u is oriented along the z-axis.

As can be seen, the ability of the FRACT to approximate $z^2$ improves as $\xi$ decreases towards 0. However, it should also be noted that as $\xi$ decreases towards 0, the energy of $\tilde{g}_u(x)$ is being distributed further and further from the origin. Since EAPs typically have concentrated signal energy at the origin, this frequently implies that the signal-to-noise ratio for the FRACT also diminishes as $\xi$ decreases. However, the value of the EAP in the region farther from the origin will typically provide more information regarding oriented anisotropic diffusion. For comparison, $\tilde{g}_u(x)$ for the FRT was illustrated in FIG. 1(b), and, unlike the FRACT, the signal from the FRT will generally be dominated by the region of the EAP near the origin. As a result, the FRT would be expected to have higher SNR than the FRACT, but could be less sensitive to tissue orientation due to signal leakage from regions near the origin in the plane orthogonal to u.

FIG. 3 illustrates magnitudes of spherical harmonic eigenvalues for different transforms as a function of the spherical harmonic degree. All of the eigenvalues in this plot are 0 for odd l, and that these values are not shown. The eigenvalues for the FRACT transforms have been scaled by $2\pi\xi^2$ for better comparison with the FRT, and $\rho$ was assumed to be 1.

Further perspective can be obtained by looking at the spherical harmonic eigenvalues for different $\xi$, as shown in FIG. 3. Spherical harmonics have the property that higher l values correspond to more oscillatory $Y_\ell^m(u)$. As a result, FIG. 3 indicates that the FRT can be viewed as a form of low-pass filter, with a tendency to emphasize the smooth and/or isotropic components of the spherical data. On the other hand, the FRACT family of transforms can be viewed as bandpass filters that emphasize the higher-frequency aspects of the data. This kind of filtering would be expected to enhance the angular resolution of FRACT. It should also be noted that the FRACT nullifies the 0th-order spherical harmonic coefficient, which corresponds to the isotropic component of the spherical function. While this implies that the FRACT does not accurately estimate isotropic ODFs, the suppression of the isotropic component can help to make the anisotropic ODF components more visible. This aspect is explored in more detail in the supplementary material. Note also that as $\xi$ decreases, the FRACT tends to reduce the contribution of the low-degree spherical harmonics. In addition, it is possible to obtain a more uniform high-pass eigenvalue curve (with reduced eigenvalue oscillations) through the linear combination of two or more FRACTs with different values of $\xi$.

Practical Implementation

The transforms considered so far have all been derived under the assumption that there is access to E(q) for all $q \in S_\rho^2$. However, practical HARDI data may only provide the value of E(q) on a finite set of N points. This discrepancy may require the use of special data processing approaches. A common approach in the literature has been to assume that the true E(q) is relatively smooth, such that it can be approximated by a truncated spherical harmonic series with a maximum degree of L, see Descoteaux, M., Angelino, E., Fitzgibbons, S., Deriche, R., 2007, "*Regularized, fast, and robust analytical Q-ball imaging*", Magn. Reson. Med. 58, 497-510; Anderson, A. W., 2005, "*Measurement of fiber orientation distributions using high angular resolution diffusion imaging*", Magn. Reson. Med. 54, 1194-1206; Hess, C. P., Mukherjee, P., Han, E. T., Xu, D., Vigneron, D. B., 2006, "*Q-ball reconstruction of multimodal fiber orientations using the spherical harmonic basis*", Magn. Reson. Med. 56, 104-117:

$$E(q) \approx \sum_{\ell=0}^{L} \sum_{m=-\ell}^{\ell} c_{\ell m} Y_\ell^m(q). \qquad (20)$$

Given this signal model, the harmonic coefficients can be estimated, e.g., by least-squares fitting to the sampled data. In practice, this inverse problem can be ill-posed, and Descoteaux, M., Angelino, E., Fitzgibbons, S., Deriche, R., 2007, "*Regularized, fast, and robust analytical Q-ball imaging*", Magn. Reson. Med. 58, 497-510 introduced a linear regularization scheme that uses the Laplace-Beltrami operator to regularize the solution. The Laplace-Beltrami operator provides a natural smoothness measure for functions on the sphere, and is efficient to use in this context because its eigenfunctions are the spherical harmonics. The same regularization framework may be used with the same parameters suggested by Descoteaux, M., Angelino, E., Fitzgibbons, S., Deriche, R., 2007, "*Regularized, fast, and robust analytical Q-ball imaging*", Magn. Reson. Med. 58, 497-510 to estimate the spherical harmonic coefficients. In addition, the spherical harmonics may be modified to be symmetric and real-valued as described by Descoteaux, M., Angelino, E., Fitzgibbons, S., Deriche, R., 2007, "*Regularized, fast, and robust analytical Q-ball imaging*", Magn. Reson. Med. 58, 497-510 to ensure that the estimated E(q) also has these properties. This modified spherical harmonic basis has the same eigenvalues as the original spherical harmonic basis. See Descoteaux, M., Angelino, E., Fitzgibbons, S., Deriche, R., 2007, "*Regularized, fast, and robust analytical Q-ball imaging*", Magn. Reson. Med. 58, 497-510 for further details.

Given the fitted spherical harmonic coefficients, any of the transforms described herein can be computed efficiently using (14). However, it may also be important to consider how truncation of the spherical harmonic series and finite sampling of $S_\rho^2$ influence the characteristics of the transforms, and in particular, the shape of g(u,x). While the effects of truncating the spherical harmonic series have been investigated in previous work, see Descoteaux, M., Angelino, E., Fitzgibbons, S., Deriche, R., 2007, "*Regularized, fast, and robust analytical Q-ball imaging*", Magn. Reson. Med. 58, 497-510; Anderson, A. W., 2005, "*Measurement of fiber orientation distributions using high angular resolution diffusion imaging*", Magn. Reson. Med. 54, 1194-1206; Hess, C. P., Mukherjee, P., Han, E. T., Xu, D., Vigneron, D. B., 2006, "*Q-ball reconstruction of multimodal fiber orientations using the spherical harmonic basis*", Magn. Reson. Med. 56, 104-117; Kaden, E., Kruggel, F., 2011, "*A reproducing kernel Hilbert space approach for Q-ball imaging*", IEEE Trans. Med. Imag. 30, 1877-1886, these efforts have not characterized these effects in terms of g(u,x).

Fortunately, because a linear estimation technique is used to obtain spherical harmonic coefficients from the sampled data and (13) also represents a linear operation, it is straightforward to compute the response function g(u,x) for linear transforms of the sampled data. In particular, after expressing the estimated spherical harmonic coefficients as a linear combination of the measured data $$\hat{c}_{\ell m} = \sum_{n=1}^{N} b_{n\ell m} E(q_n) \quad (21)$$

for some coefficients $\{b_{nlm}\}$, the transformed data is $$\hat{R}_G\{E(q)\}(u) = \sum_{\ell=0}^{L} \lambda_\ell^G \sum_{m=-\ell}^{\ell} Y_\ell^m(u) \sum_{n=1}^{N} b_{n\ell m} E(q_n) \quad (22)$$

$$= \int_x f(x) g(u, x) dx$$

with $$g(u, x) = \sum_{\ell=0}^{L} \sum_{m=-\ell}^{\ell} \sum_{n=1}^{N} \lambda_\ell^G b_{n\ell m} \exp(-i2\pi q_n^T x) Y_\ell^m(u). \quad (23)$$

Equation (23) can be viewed as a discrete three-dimensional non-Cartesian Fourier transform, which we efficiently approximate using convolution gridding, see Jackson, J. I., Meyer, C. H., Nishimura, D. G., Macovski, A., 1991, "*Selection of a convolution function for Fourier inversion using gridding*", IEEE Trans. Med. Imag. 10, 473-478.

FIGS. 4A-4D illustrate sampling patterns with different numbers N of total measurements.

FIGS. 5A-5H illustrate images showing the magnitude of $\tilde{g}_u(x, 0, z)$ in the x-z plane for a FRT in the presence of finite sampling of the sphere and truncation of the spherical harmonic series. FIGS. 5A-5D illustrate results using L=8; FIGS. 5E-5H illustrates results using L=32. Results can be compared to the ideal response function shown in FIG. 1B.

FIGS. 6A-6H illustrate images showing the magnitude of $\tilde{g}_u(x, 0, z)$ in the x-z plane for a FRACT with parameter $\xi=0.51\rho$, in the presence of finite sampling of the sphere and truncation of the spherical harmonic series. FIG. 6A-6D illustrate results using L=8. FIG. 5E-5H illustrate results using L=32. Results can be compared to the ideal response function shown in FIG. 2B.

To analyze the effects of sampling and spherical harmonic truncation, (23) may be computed for a variety of different sampling schemes and a variety of different values of L. In the results that follow, findings are reported for the four different sampling schemes shown in FIG. 4. These sampling patterns were obtained using a model of electrostatic repulsion to distribute the sampling locations as evenly as possible on the surface of the sphere, see Jones, D. K., Horsfield, M. A., Simmons, A., 1999, "*Optimal strategies for measuring diffusion in anisotropic systems by magnetic resonance imaging*", Magn. Reson. Med. 42, 515-525. Profiles illustrating typical behaviors for g(u,x) for the FRT and the FRACT are shown in FIGS. 5 and 6, respectively. As can be seen, both limited L and limited N can distort the shape of g(u,x) for both transforms, though the response functions still maintain most of the important features of the ideal FRT and FRACT when L is 8 or larger and N is larger than 64.

DISCUSSION AND CONCLUSION

This application introduced a new family of transforms for data sampled on the Fourier 2-sphere. Compared to existing methods for processing such data, these transforms may be linear, flexible, and can be computed efficiently. The transforms may have analytic characteristics for continuous data, and new methods for evaluating and characterizing these kinds of transforms in the context of sampled data have been described.

Also discussed was one special case of this family of transforms, the FRACT, which can be applied to HARDI data to estimate oriented diffusion. Compared to the existing FRT, the FRACT has significant advantages in its ability to accurately resolve the angular orientation of anisotropic structures from DW-MRI data. These advantages were confirmed with extensive simulations and real MR data in Haldar, J. P., Leahy, R. M., 2013b, "*Linear transforms for Fourier data on the sphere: Application to high angular resolution diffusion MRI of the brain*", NeuroImage 71, 233-247. The FRACT was also compared to state-of-the-art nonlinear ODF estimation methods. Results demonstrated that the FRACT can be as useful or even more useful than these alternative approaches for estimating orientation information. In addition, unlike the nonlinear approaches, the FRACT may have analytic theoretical properties and may not require the use of unrealistic modeling assumptions. This makes FRACT-based ODF estimation attractive for practical in vivo applications, where strong modeling assumptions are unlikely to be satisfied.

The FRACT is one of the most simple extensions of the FRT. More complicated choices of the G(•) kernel function may lead to even better performance. For example, by using more than just one cosine-modulated Bessel function, it may be possible to more accurately approximate $z^2$, or to synthesize functions to, e.g., approximate $z^p$ for some value of p. The latter type of function could enable characterizable linear transform methods to estimate the higher-order moments of the EAP from HARDI data. In addition to considering alternate members of the family of transforms that can be expressed by (2), it may also be of interest to explore families of linear transforms that are more general than (2). For example, FRACT results could potentially be even further improved by employing a deconvolution-based ODF-sharpening approach that was previously proposed to improve the FRT, see Descoteaux, M., Angelino, E., Fitzgibbons, S., Deriche, R., 2007, "*Regularized, fast, and robust analytical Q-ball imaging*", Magn. Reson. Med. 58, 497-510. Indeed, it was shown in Haldar, J. P., Leahy, R. M., 2013b, "*Linear transforms for Fourier data on the sphere: Application to high angular resolution diffusion MRI of the brain*", NeuroImage 71, 233-247 that linear spherical deconvolution methods are theoretically equivalent to our proposed family of linear transform methods, meaning that all of the tools and theoretical characterizations we've developed can also be applied to spherical deconvolution methods. As a final diffusion MRI example, there can be interesting generalizations of the family of transforms to the case where diffusion data is sampled on the surface of multiple spheres, see Wu, Y. C., Alexander, A. L., 2007. "*Hybrid diffusion imaging*", NeuroImage 36, 617-629; Khachaturian, M. H., Wisco, J. J., Tuch, D. S., 2007, "*Boosting the sampling efciency of q-ball imaging using multiple wavevector fusion*", Magn. Reson. Med. 57, 289-296.

While the proposed approach was derived for the context of diffusion MRI, the approach could theoretically be applied to any kind of data sampled on the sphere in the Fourier domain. Since many sensing/imaging/other methods acquire data in the Fourier domain, it is completely possible that the proposed transforms could be applied to other datasets.

Figure 7:
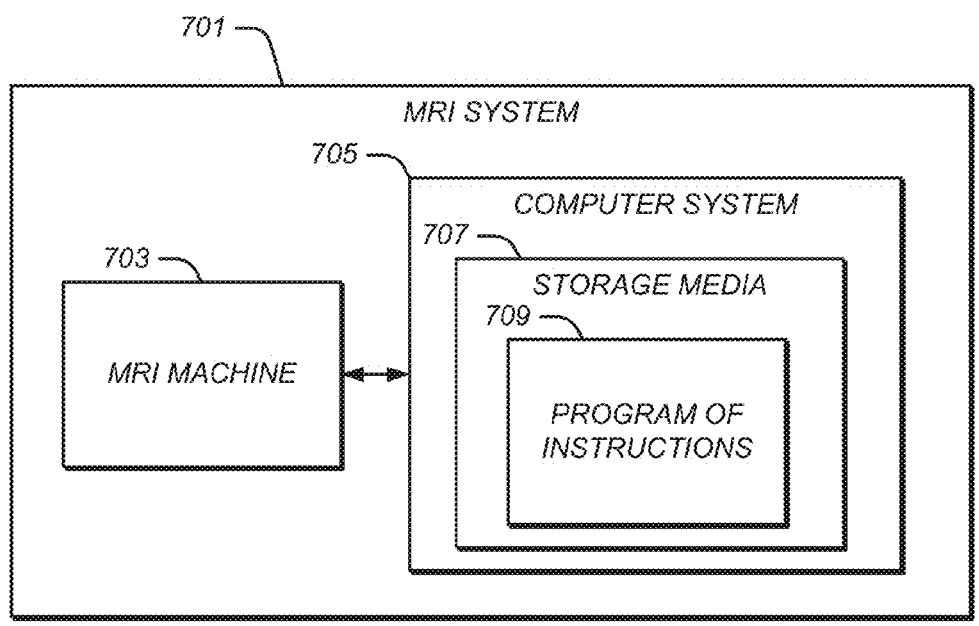
FIG. 7 illustrates an example of an MRI system.

FIG. 7 illustrates an example of an MRI system 701. The MRI system may include an MRI machine 703 and a computer system 705 that includes a non-transitory, computer-readable storage media 707 that may contain a program of instructions that is configured to cause the computer system 705 running the program of instructions to perform any one, any combination, or all of the data handling and computation equations, algorithms, and functions described above.

The computer system 705 includes one or more processors, tangible memories (e.g., random access memories (RAMs), read-only memories (ROMs), and/or programmable read only memories (PROMS)), tangible storage devices (e.g., hard disk drives, CD/DVD drives, and/or flash memories), system buses, video processing components, network communication components, input/output ports, and/or user interface devices (e.g., keyboards, pointing devices, displays, microphones, sound reproduction systems, and/or touch screens).

The computer system 705 may include one or more computers at the same or different locations. When at different locations, the computers may be configured to communicate with one another through a wired and/or wireless network communication system.

Each computer system may include software (e.g., one or more operating systems, device drivers, application programs, and/or communication programs). When software is included, the software includes programming instructions and may include associated data and libraries. When included, the programming instructions are configured to implement one or more algorithms that implement one or more of the functions of the computer system, as recited herein. The description of each function that is performed by each computer system also constitutes a description of the algorithm(s) that performs that function.

The software may be stored on or in one or more non-transitory, tangible storage devices, such as one or more hard disk drives, CDs, DVDs, and/or flash memories. The software may be in source code and/or object code format. Associated data may be stored in any type of volatile and/or non-volatile memory. The software may be loaded into a non-transitory memory and executed by one or more processors.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and advantages. These also include embodiments in which the components and/or steps are arranged and/or ordered differently.

For example, the FRACT may be computed using numerical integration methods instead of using the approach based on spherical harmonic representation of the data. Similarly, linear transforms may be used that are different linear combinations of the transform kernels described in Table 1.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A non-transitory, tangible, computer-readable storage medium containing a program of instructions that cause a computer system running the program of instructions to:
receive samples of a Fourier transform of a diffusion MR signal that are distributed in a generally spherically-shaped pattern on a surface of at least one sphere;
assemble the samples to form a profile function having a domain that is a surface of at least one sphere;
determine information indicative of at least one property of the signal by applying a spherical linear transform to the profile function, wherein the spherical linear transform uses more than just an equator of the profile function for each of multiple orientations; and
use the determined information to generate images or maps.

2. The storage medium of claim 1 wherein the samples of a Fourier transform include diffusion MRI data and the signal is a diffusion function.

3. The storage medium of claim 2 wherein the program of instructions causes the computer system to calculate a response function of the spherical linear transform.

4. The storage medium of claim 3 in which the calculated response function accounts for finite sampling of the sphere.

5. The storage medium of claim 4 in which the calculating the response function uses re-gridding and a Fast Fourier Transform.

6. The storage medium of claim 3 wherein the program of instructions causes the computer system to select the spherical linear transform based on an anticipated accuracy of the information that results from application of the selected spherical linear transform.

7. The storage medium of claim 2 wherein the program of instructions causes the computer system to evaluate the spherical linear transform using a computational algorithm based on a spherical harmonic representation of a transform kernel.

8. The storage medium of claim 2 wherein the at least one determined property of the diffusion function includes a constant solid-angle orientation distribution function.

9. The storage medium of claim 2 wherein the spherical linear transform includes a Funk-Radon and Cosine Transform or a weighted sum or integral of multiple Funk-Radon and Cosine Transforms.

10. The storage medium of claim 2 wherein the determining the at least one property of the diffusion function includes augmenting the spherical linear transform with nonspherical or nonlinear processing.

11. The storage medium of claim 1 wherein the program of instructions causes the computer system to determine how accurately the information indicates the at least one property by calculating a response function of the spherical linear transform.

12. The storage medium of claim 11 in which the calculated response function accounts for finite sampling of the sphere.

13. The storage medium of claim 12 in which the calculating the response function uses re-gridding and a Fast Fourier Transform.

14. The storage medium of claim 11 wherein the program of instructions causes the computer system to select the spherical linear transform based on an anticipated accuracy of the information that results from application of the selected spherical linear transform.

15. The storage medium of claim 1 wherein the at least one determined property of the signal include moments or weighted moments of the signal or its radial projections.

16. The storage medium of claim 1 wherein the program of instructions causes the computer system to evaluate the spherical linear transform using a computational algorithm based on a spherical harmonic representation of a transform kernel.

17. The storage medium of claim 1 wherein the spherical linear transform includes a Funk-Radon and Cosine Transform or a weighted sum or integral of multiple Funk-Radon and Cosine Transforms.

18. The storage medium of claim 1 wherein the determining the at least one property of the signal includes augmenting the spherical linear transform with nonspherical or nonlinear processing.

19. An MRI system comprising:
an MRI machine that generates diffusion MRI data;
a computer system; and
a computer-readable storage medium containing a program of instructions that cause the computer system running the program of instructions to:
receive samples of a Fourier transform of a signal that are distributed in a generally spherically-shaped pattern on a surface of at least one sphere;
assemble the samples to form a profile function having a domain that is a surface of at least one sphere;
determine information indicative of at least one property of the signal by applying a spherical linear transform to the profile function, wherein the spherical linear transform uses more than just an equator of the profile function for each of multiple orientations; and
generates images or maps using the determined information,
wherein the samples of a Fourier transform include the diffusion MRI data and the signal is a diffusion function.

* * * * *